PRINTED CIRCUIT BOARDS AND THEIR FABRICATION

Filed June 13, 1963

INVENTORS G. BITTRICH
R. A. EHRHARDT
BY
ATTORNEY

United States Patent Office 3,306,830

Patented Feb. 28, 1967

3,306,830

PRINTED CIRCUIT BOARDS AND THEIR FABRICATION

Gustav Bittrich and Robert A. Ehrhardt, New Providence, N.J., assignors to Bell Telephone Laboratories, Incorporated, New York, N.Y., a corporation of New York Filed June 13, 1963, Ser. No. 287,552

6 Claims. (Cl. 204—15)

Figure 1A:
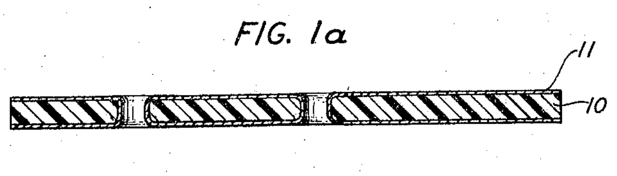

This invention relates to electroless cobalt coating methods and more particularly to such methods as applied to the fabrication of printed circuit boards.

For some time it has been recognized that electrodeposition is an effective way to obtain a tortuous circuit configuration on an appropriately metallized and masked wiring board. Since the deposit occurs on the unmasked or circuit portion only, there is little waste of material and miniature circuits of intricate design can be obtained with high dimensional precision. However, difficulty is encountered when the circuit to be plated contains several electrically isolated conductor paths since each such region must be made cathodic. For such cases a more universal approach is often used wherein a conductive sheet is formed over the entire surface of the board, the desired circuit pattern is printed on and masked and the unwanted areas are etched away. This procedure has also achieved significant commercial success.

Many devices of current interest require the printing of circuits on both sides of the wiring board. Such structures typically employ "through" connections which extend from a conductive region on one side of the board through a hole in the board and terminate in contact with a conductive region on the reverse side of the board. The aforementioned fabrication techniques are not particularly suited to printing circuits on boards of this type due to the difficulty of masking the holes and various other problems related to the obtaining of an initial conductive surface.

Various of the techniques proposed for obtaining an initial conductive layer on an insulating board such as metal evaporation and metal spraying are not adapted for use on boards with through connections. For this reason, among others, the art has found electroless coating methods to be particularly useful. Such methods rely on deposition by chemical precipitation from a solution and are effective in coating remote areas such as the interior surfaces of holes. Electroless coatings of silver or copper are generally suggested. However, silver tends to migrate under the influence of electric fields introducing the danger of current leakage paths particularly where the circuit pattern is small and the conductive paths are closely spaced. Electroless silver solutions as well as electroless copper solutions are extremely unstable and consequently difficult and wasteful to use.

As a substitute for these materials nickel has been suggested and tried. However, nickel solutions, though superior in stability to silver or copper solutions, are occasionally spontaneously reduced with deposition occurring on the walls and other parts of the apparatus necessitating shut-down and cleaning to removal all stray metal. Furthermore nickel is not well suited to fabrication procedures which require etch-removal of nickel since it is extremely etch resistant. Attempts to remove even very thin nickel films involve such severe etch treatment that serious undercutting of the plated circuit occurs.

This invention is directed to fabrication of printed circuits on an insulating board by first coating the board with a conductive film of cobalt. Cobalt can be easily stripped from the board using mild etch solutions without excessively attacking the circuit pattern.

A further aspect of this invention concerns a method for the electroless deposition of cobalt which method relies primarily on an electroless cobalt solution exhibiting unexpected stability. In particular, electroless solutions of a composition according to this aspect of the invention possess an essentially infinite shelf life, do not spontaneously decompose during use and can be rejuvenated and re-used continuously. These factors are of significant technological importance both in convenience and economy.

Figure 1B:
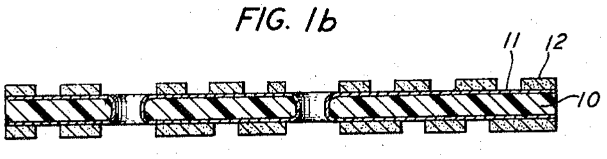
Figure 1C:
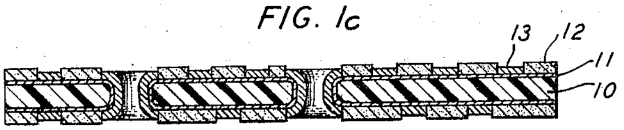
Figure 1D:
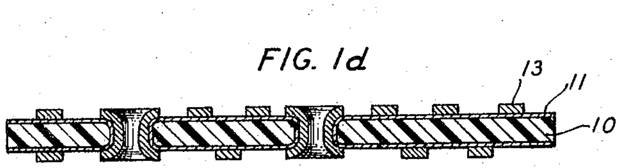
Figure 1E:
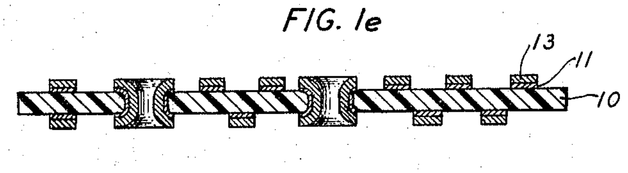
Figure 1F:
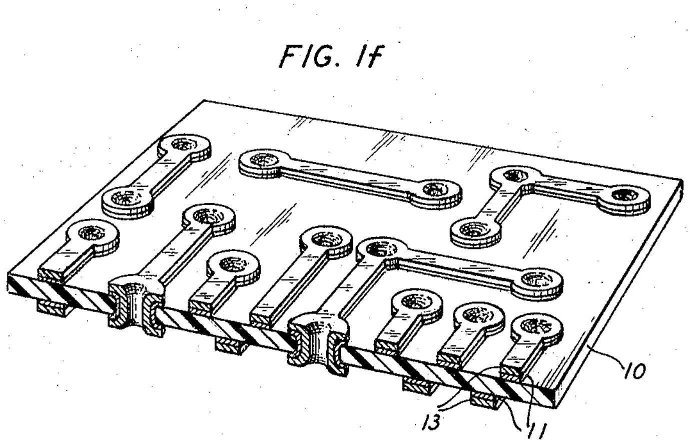

These and other aspects of the invention may perhaps be more easily appreciated when considered in conjunction with the drawing in which:

FIGS. 1*a* to 1*e* are a series of front elevation views illustrating the sequential steps of an exemplary fabrication sequence which incorporates the present invention; and FIG. 1*f* is a perspective view of the finished article resulting from the fabrication described with reference to FIGS. 1*a* to 1*e*.

The insulating wiring boards are first sensitized by a procedure well known in the art. In particular the board is immersed for several minutes in a 10% stannous chloride solution, rinsed in water and then immersed for a few minutes in an aqueous solution containing approximately one gram per liter of palladium chloride and rinsed. The cobalt coating 11, FIG. 1*a*, is then applied to the sensitized surface 10 by immersing the board in a solution having the following composition:

| | | |
|---|---|---|
| $CoCl_2 \cdot 6H_2O$ | g./l. | 40 |
| $Na_3C_6H_5O_7 \cdot 2H_2O$ | g./l. | 50 |
| $NaH_2PO_2 \cdot H_2O$ | g./l. | 40 |
| Triethanolamine | ml./l. | 15 |

This solution is maintained at approximately 100° C. The cobalt film is allowed to build up to the desired thickness, which for this application is appropriately 0.01 mil to 0.03 mil. The deposition rate under the conditions prescribed is approximately 0.01 mil per minute.

It has been found that in coating boards with smooth surface adherence can be improved somewhat by first treating the board with a wet-abrasive surface blast to give a slightly roughened surface texture. In some cases the adherence of the layer is improved by baking the cobalt-coated board for several minutes at a temperature of 130° C.

The cobalt layer is then masked with a negative resist 12 as indicated in FIG. 1*b*. The resist can be formed by any of several known methods. Silk screening is particularly useful when processing many boards. Alternatively photo resist may be used. Each of these techniques is now well developed in the art.

The board is then introduced into an appropriate electrolyte and the circuit pattern 13, FIG. 1*c*, is copper plated to the desired thickness. The copper plating step per se forms no basis for this invention and any suitable electrolyte and plating conditions may be used. An electrolyte of copper sulfate and sulfuric acid is appropriate. Acid baths are preferred since the usual masking materials are less resistive to high pH. The thickness of the copper layer will vary according to the electrical requirements of the circuit, the spacing between conductors and the general physical characteristics desired such as ruggedness, corrosion resistance, etc. For ordinary purposes one or two mils is generally adequate. This electrolytic plating step is effective for plating the walls of holes extending through the board. In particular holes of approximately 60 mils in diameter and 135 mils in depth were satisfactorily plated using this procedure.

In connection with the electroplating step it is significant to note that the presence of the cobalt under-layer over essentially the entire board surface permits a single electrical contact to render all the regions to be plated cathodic. This fact is quite significant where the circuit pattern contains several "islands" or electrically isolated conductor regions.

After electroplating the circuit pattern the resist is removed with an appropriate organic solvent such as benzol leaving a structure as shown in FIG. 1*d*. The exposed cobalt film is then etched away using a mild etch. The board now appears as in FIG. 1*e*. Since the copper circuit pattern is several times the thickness of the cobalt film the cobalt is easily removed without excessively damaging the circuit. An appropriate etchant for this purpose is ammonium persulfate. The completed printed wiring board is seen in perspective in FIG. 1*f*.

For certain applications demanding extreme tolerances and dependability it is preferred to modify the foregoing procedure by incorporating two additional steps. First, the cobalt film may be covered with a copper strike before applying the resist. This strike plate is applied electrolytically to a thickness of the order of the thickness of the cobalt film and forms a more rugged initial layer which is more resistant to damaging during handling and during the application of the resist. Secondly, the electroplated circuit can be covered with a final solder plate or gold plate to protect it during the final etch removal. Solder plating of standard lead-tin solders and gold plating are conventional in the art. The thickness of this plate to achieve the desired purpose should be of the order of 0.1 mil.

The electroless plating solution, which forms a part of this invention, may vary in composition within the following limits:

Cobalt calc. as metal ion: 1 gram/liter to saturation at room temperature
Sodium citrate calc. as hydrate: 3 grams/liter to saturation at room temperature
Sodium hypophosphite calc. as hydrate: 10 grams/liter to saturation at room temperature
Triethanolamine: 5 to 50 milliliter/liter.

The ration of sodium citrate to cobalt has been found to be extremely critical. Deposition will not occur to any appreciable extent if the molal ratio of citrate to cobalt drops below 1 to 1. However, as the ratio exceeds 1:1 the deposition occurs readily at an essentially maximum rate. At a molal ratio, citrate to cobalt, of 2:1 the rate of deposition falls to ¼ of the rate at a 1:1 ratio. Consequently, the citrate to cobalt molal ratio should be maintained within 1.01:1 *to* 2:1 and conveniently within 1.05:1 *to* 2:1.

The temperature of the electroless solution during deposition is a pronounced factor affecting the deposition rate. Deposition is somewhat slow unless the solution is heated. Generally temperatures in the range of 60° C. to the boiling point give good results. The deposition rate approximately doubles for each 10° C. increase in temperature. However as the bath temperature nears the boiling point losses of solution due to evaporation introduce some difficulty and the heat of vaporization becomes a factor to be considered. Consequently it is usually most convenient to operate in the range of 70° C. to 90° C. Certain applications, for instance in producing ornamental coatings, may require a smooth reflective surface. This is best obtained by using slow deposition rates since the surface becomes duller as the rate increases.

The pH of the solution has also been found to be critical to the obtaining of good quality coatings. The pH should be controlled within the range 6.6 to 8.2, and preferably 7.2 to 7.6, as measured at 100° C. It is important to consider the temperature at which the pH is measured since with the solution of this invention the pH varies significantly over small temperature ranges.

The surprising and unexpected stability of the foregoing electroless solution is demonstrated by its ability to operate over several months duration by merely periodically restoring cobalt ions in the bath. It does not spontaneously decompose and even tolerate localized agitation and heating to the extent that it can be heated with an immersion heater.

The inclusion of triethanolamine serves to buffer the solution in the desired pH range. Additionally this ingredient contributes to the stability due to its low vapor pressure in the temperature ranges used. Consequently the pH will remain relatively constant for long periods of operation. When the pH does become too low it may be adjusted by the addition of a basic solution such as sodium hydroxide.

Whereas the foregoing description of the electroless cobalt solution refers to specific ingredients, certain variations and modifications can be made without departing from the spirit and scope of the invention. For instance, the use of potassium or lithium salts for the sodium salts prescribed would be obvious. Also other tertiary or even secondary amines may be found which achieve the same purposes as the triethanolamine described.

This procedure for depositing cobalt by chemical reduction from an electroless solution will find various applications. However a preferred use of this technique is in connection with the fabrication of printed circuits as described in this specification. While that description alludes to the fabrication of printed circuits it will be understood that the same general technique may be applied to the manufacture of circuits which includes passive and active circuit elements and various related applications may be found. Any such procedure wherein a cobalt coating or film is obtained according to the foregoing teachings is considered within the scope of this invention.

What is claimed is:

1. A method for fabricating a printed circuit on an insulating surface comprising the steps of depositing an initial conductive film of cobalt on the insulating surface by the application to the surface of an electroless cobalt solution having the composition:

Cobalt: 1 gram/liter to saturation at room temperature
Alkali metal citrate: 3 grams/liter to saturation at room temperature
Alkali metal hypophosphite: 10 grams/liter to saturation at room temperature
Triethanolamine: 5 to 50 milliliters/liter said solution having a molal ratio of citrate to cobalt within the range of 1:1 to 3:1 and maintaining the solution at a temperature in the range of 60° C. to the boiling point, and at a pH value in the range of 6.6 to 8.2 as measured at 100° C. while depositing cobalt to the desired thickness, applying a negative resist pattern of the desired circuit configuration, electrolytically depositing a conductive layer of copper onto the exposed regions of the cobalt film, removing the resist and etching away the cobalt film from the exposed regions.

2. The method of claim 1 wherein the cobalt film is deposited to a thickness of 0.01 to 0.03 mil.

3. A method for fabricating a printed circuit on an insulating surface comprising the steps of depositing a conductive film of cobalt onto the insulating surface by the application to the surface of an electroless cobalt solution having the composition:

Cobalt: 1 gram/liter to saturation at room temperature
Alkali metal citrate: 3 grams/liter to saturation at room temperature
Alkali metal hypophosphite: 10 grams/liter to saturation at room temperature
Triethanolamine: 5 to 50 milliliters/liter said solution having a molal ratio of citrate to cobalt within the range of 1:1 to 3:1 and maintaining the solution at a temperature in the range of 60° C. to the boiling point, and at a pH value in the range of 6.6 to 8.2 as measured at 100° C. during deposition, electroplating a thin layer of copper onto the cobalt film, applying a negative resist pattern of the desired circuit configuration, electroplating the exposed circuit configuration to the desired conductor thickness, electroplating a material selected from the group consisting of gold and solder onto the copper circuit pattern, removing the resist and etching away the exposed cobalt and copper films.

4. The method of claim 3 wherein the etchant for the etching step is ammonium persulfate.

5. An electroless cobalt plating solution consisting essentially of:

Cobalt: 1 gram/liter to saturation at room temperature
Alkali metal citrate: 3 grams/liter to saturation at room temperature
Alkali metal hypophosphite: 10 grams/liter to saturation at room temperature
Triethanolamine: 5 to 50 milliliters/liter said solution having a molal ratio of citrate to cobalt in the range 1:1 to 2:1 and having a pH in the range of 6.6 to 8.2 as measured at 100° C.

6. A process for the electroless deposition of cobalt on an insulating substrate which comprises immersing the surface to be coated in a solution consisting essentially of:

Cobalt: 1 gram/liter to saturation at room temperature

Alkali metal citrate: 3 grams/liter to saturation at room temperature.
Alkali metal hypophosphite: 10 grams/liter to saturation at room temperature
Triethanolamine: 5 to 50 milliliters/liter said solution having a molal ratio of citrate to cobalt in the range 1:1 to 2:1 and having a pH in the range of 6.6 to 8.2 as measured at 100° C.

References Cited by the Examiner

UNITED STATES PATENTS

| | | | |
|---|---|---|---|
| 2,912,312 | 11/1959 | Japel | 204—15 |
| 3,006,819 | 10/1961 | Wilson et al. | 204—15 |
| 3,095,309 | 6/1963 | Zeblisky et al. | 117—130 |
| 3,099,608 | 7/1963 | Radousky et al. | 204—15 |
| 3,219,471 | 11/1965 | Chilton et al. | 117—71 |

OTHER REFERENCES

Brenne et al.: "Deposition of Nickel and cobalt by Chemical Reduction," Journal of Research of the National Bureau of Standards, vol. 39, Research Paper RP 1835, pages 385–395, November 1947.

JOHN H. MACK, *Primary Examiner.*

T. TUFARIELLO, *Assistant Examiner.*